United States Patent [19]

Wu

[11] Patent Number: 5,017,983
[45] Date of Patent: May 21, 1991

[54] AMORPHOUS SILICON THIN FILM TRANSISTOR WITH A DEPLETION GATE

[75] Inventor: Biing-Seng Wu, Tainan, Taiwan

[73] Assignee: Industrial Technology Research Institute, Taiwan, Taiwan

[21] Appl. No.: 389,227

[22] Filed: Aug. 3, 1989

[51] Int. Cl.$^5$ ............... H02L 22/12; H02L 29/78; H02L 27/01
[52] U.S. Cl. ................................ 357/23.7; 357/4; 357/23.14
[58] Field of Search ............. 357/23.14, 23.7, 4, 357/23.24

[56] References Cited

U.S. PATENT DOCUMENTS

| | | | |
|---|---|---|---|
| 3,500,137 | 3/1970 | Schroen et al. | 357/23.7 |
| 4,425,544 | 1/1984 | Barth | 357/23.7 |
| 4,532,536 | 7/1985 | Hatanaka et al. | 357/23.7 |

FOREIGN PATENT DOCUMENTS 60-83370  5/1985  Japan ................ 357/23.7

OTHER PUBLICATIONS

*IBM Technical Disclosure Bulletin*, vol. 32, No. 1 (Jul. 1989) pp. 164–165.

H. C. Tuan et al, "Dual-Gate a-Si:H Thin Film Transistors", *IEEE Electron Device Letters*, vol. EDL-3 (Dec. 1982) pp. 357–359.

J. G. Fossum et al. "Anomalous Leakage Current in LPCVD Polysilicon MOSFET's" *IEEE Transactions on Electron Devices*, vol. ED-32 (Sep. 1985) pp. 1878–1884.

T. Kodama et al. "A Self-Alignment Process for Amorphous Silicon Thin Film Transistors", *IEEE Electron Device Letters, vol. EDL-3, No. 7, (Jul. 1982) pp. 137–139*.

K. Okamoto et al., "MES-FETs Fabricated on Doped a-Si Films", *Japanese Journal Applied Physics, vol. 24, (Aug. 1985), No. 8, pp. L632–L634*.

*Primary Examiner*—J. Carroll
*Attorney, Agent, or Firm*—Darby & Darby

[57] ABSTRACT

The present invention is a high speed thin film transistor with an accumulation gate and a depletion gate. When a positive voltage is applied to the accumulation gate, the electrons are accumulated in the channel region of the accumulation gate and the transistor is operated at the "on" state. If a negative voltage is applied to the depletion gate, the accumulated electrons are depleted, and the transistor is operated at the "off" state. The on-current of the thin film transistor is the same as that of conventional thin film transistors; however, a smaller off-current of the transistor is obtained.

4 Claims, 3 Drawing Sheets

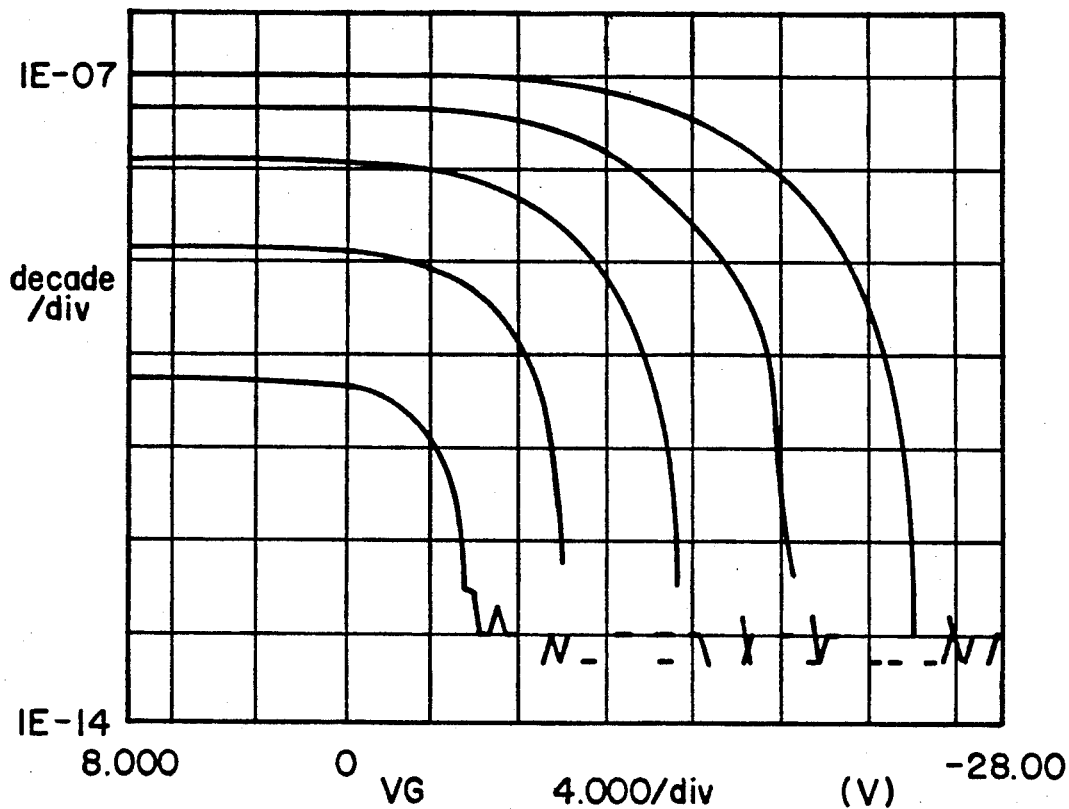

AMORPHOUS SILICON THIN FILM TRANSISTOR WITH A DEPLETION GATE

BACKGROUND OF THE INVENTION

The various known techniques for making thin film transistors (TFTs), particularly the staggered type amorphous silicon (a-Si) thin film transistors, lead inevitably to causing the transistor gate or "grid" to be overlapped by its source and drain. The grid length equals the summation of the channel length, source/grid overlap, and drain/grid overlap, as shown in FIG. 1. The large grid length and the overlaps introduce stray capacitance, which increases the response time of the thin film transistor. Hence, the operation frequency of the a-Si logic integrated circuit is restrained. Moreover, because of the charge redistribution between the stray capacitance and the load capacitance, the signal on the grid can couple to the load. This effect can introduce an unacceptable DC voltage level when these components are used in liquid crystal display devices, and cause a voltage shift when these components are used in logic integrated circuits. In order to reduce the charge redistribution effect, a storage capacitor connected in parallel with the LC cell or the load is required. However, the parallel storage capacitor reduces the operating speed of the transistor and it can restrain the number of scan line in liquid crystal display.

Recently many new thin film transistor manufacturing processes for metal insulator semiconductor field effect transistors (MISFETs) have been proposed enabling the transistor grid to be aligned with the drain and source, thus eliminating the overlap capacitances almost entirely. Such processes have been described in the article in *IEEE Electron Device Letters*, Vol. EDL-3, No. 7 (July 1982), entitled "A Self-Alignment Process for Amorphous Silicon Thin Film Transistors," by T. Kodama et al. and in U.S. Pat. No. 4,587,720 (May 13, 1986) entitled "Process for the Manufacture of a Self-Aligned Thin-Film Transistor" by Chenevas-Paule et al. These manufacturing techniques employ a photoresist lift-off process to form the source and drain regions. When the lift-off process is used to fabricate the a-Si thin film transistors, the n+ a-Si layer is deposited on photoresist. The deposition temperature of the n+ a-Si layer is higher than 200° C., and therefore a high temperature photoresist must be used.

The a-Si metal semiconductor field effect transistor (MESFET) was also fabricated. There is a space between the grid and the source (or drain) of the MESFET. Therefore, the stray capacitance can be eliminated entirely. Such a device was described, in an article in the *Japanese Journal of Applied Physics*, Vol. 24, No. 8 (Aug., 1985), pp. L632–L634, entitled "MESFETs Fabricated on Doped a-Si Films" by K. Okamoto et al. However, the thickness of the active layer is very critical. With too thick an active layer, the FET cannot be switched off. With too thin an active layer, the on-current and the transconductance of the FET degrade drastically. Moreover, the high leakage current and low breakdown voltage of the a-Si Schottky gate diode make the device exhibit high gate current and low operation gate voltage, causing the transistor to exhibit a high off-current.

SUMMARY OF THE INVENTION

The object of the present invention is the structure of and the process for producing a thin film transistor having the merits of both an MES-TFT and an MIS-TFT. The device has an accumulation gate on the bottom of the active semiconductor layer and a depletion gate on the top of the active semiconductor layer. The gate length of the depletion gate is smaller than that of the accumulation gate.

The process for producing a thin film transistor with accumulation and depletion gates includes the following steps:

(a) producing the accumulation gate electrode on a substrate of glass;
(b) depositing an insulating layer (bottom insulator) on, the substrate and electrode;
(c) depositing a hydrogenated amorphous silicon layer on the insulating layer;
(d) depositing an insulating layer (top insulator) on the amorphous silicon layer;
(e) depositing and developing a photoresist layer to open the source and drain region;
(f) etching the top insulating layer until the a-Si layer is bare;
(g) eliminating the remaining photoresist;
(h) depositing n+ a-Si film as the ohmic-contact layer of the transistor;
(i) depositing and developing a photoresist layer for the n+ a-Si layer;
(j) etching the n+ a-Si layer until the top insulator between the source-drain region and the bottom insulator beyond the TFT region is bare;
(k) eliminating the remaining photoresist;
(l) depositing metal film on the entire wafer;
(m) depositing and developing a photoresist layer for the source-drain contact and the depletion gate electrode;
(n) etching the metal film to form the depletion gate electrode and source-drain electrode; and
(o) eliminating the remaining photoresist.

The depletion gate electrode and source-drain contact electrodes are produced simultaneously and so there are no additional process steps relative to conventional TFT manufacturing.

In operation, the accumulation gate is positive biased and the depletion gate is negative biased with respect to the source electrode. When the accumulation gate is biased and the depletion gate is floating or zero biased, the electrons are accumulated in the active layer (i.e., undoped layer), and the TFT is at the on-state. When the accumulation gate and depletion gate are biased simultaneously, the accumulated electrons below the depletion gate are depleted, and the drain current of the TFT decreases. If the bias of the depletion gate is increased further, holes are accumulated below the depletion gate, and a p-region is formed so that the TFT is in the off-state. In the off state, the depletion gate is reverse-bias p-n junction isolated and therefore the off-current of the TFT of the invention is smaller than that of a conventional a-Si TFT (which is controlled by the sheet resistance of the undoped layer). The vertical field (which increases with the voltage difference between top gate and bottom gate) is much larger than the horizontal field (which increases with the drain to source voltage); hence the clearance between the depletion gate and the drain region does not change the current-voltage characteristic of the device; i.e., the clearance does not affect the threshold voltage of the TFT of the invention.

FIG. 5 shows the transfer characteristics of the invention under the following bias conditions: (1) drain voltage =5V to 9V; (2) source voltage =0V; (3) the accumulation gate is biased from −5V to 20V; and (4) the depletion gate is floating, i.e., it is biased as in a conventional thin film transistor. The "off-current" is larger than 1 pA. FIG. 6 shows the transfer characteristics of the invention under a drain voltage of 5V. Each line in this figure responds to a bias on accumulation gate of 5V, 10V, 15V, 20V, 25V, respectively; and the depletion gate is biased from 10V to −30V. The "on-current" is the same as that of conventional TFT; however, the "off-current" can be reduced to 0.1 pA, which is two orders of magnitude less than that of conventional amorphous silicon thin film transistor.

The Id versus Vd characteristics under an accumulation gate bias of 25V is shown in FIG. 6. The I-V characteristic is very similar to that of conventional TFT except for the bias conditions.

BRIEF DESCRIPTION OF THE DRAWINGS

FIG. 6 is a graph illustrating the transfer characteristics of the TFT under the bias conditions in accordance with the invention.

FIG. 7 is a graph illustrating the Id versus Vd characteristics of the TFT under the bias conditions in accordance with the invention.

DESCRIPTION OF THE PREFERRED EMBODIMENT

Figure 1:
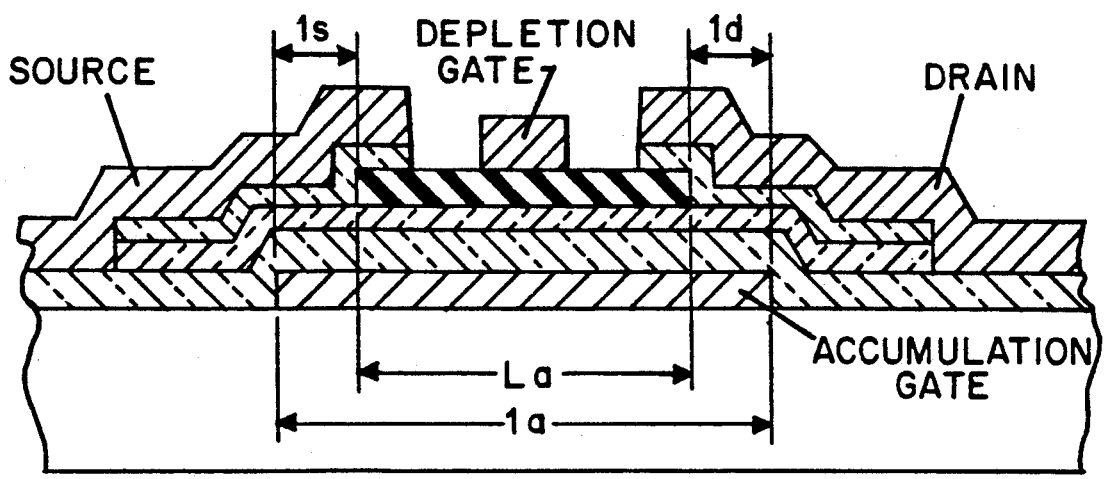
FIG. 1 is a cross-sectional view of the invention, showing that the grid length of the accumulation gate la equals the sum of the accumulation channel length La, the source/grid overlap 1s, and the drain/grid overlap 1d.
Figure 2:
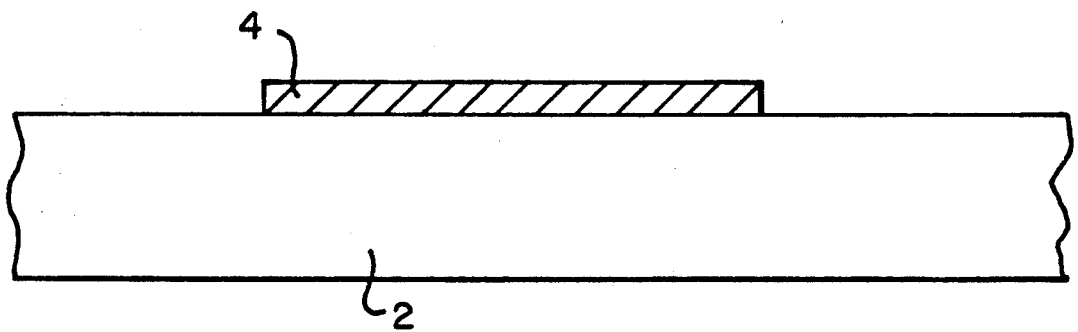
FIG. 2 is a cross-sectional view of the accumulation gate.

As represented in FIG. 2, the first step of the process for making the invention consists in making the accumulation gate 4 on the glass substrate 2, using classical methods of photolithography (masking and etching). The accumulation gate 4, having for example a thickness of 2000 Angstroms, is made preferably of chromium.

Figure 3:
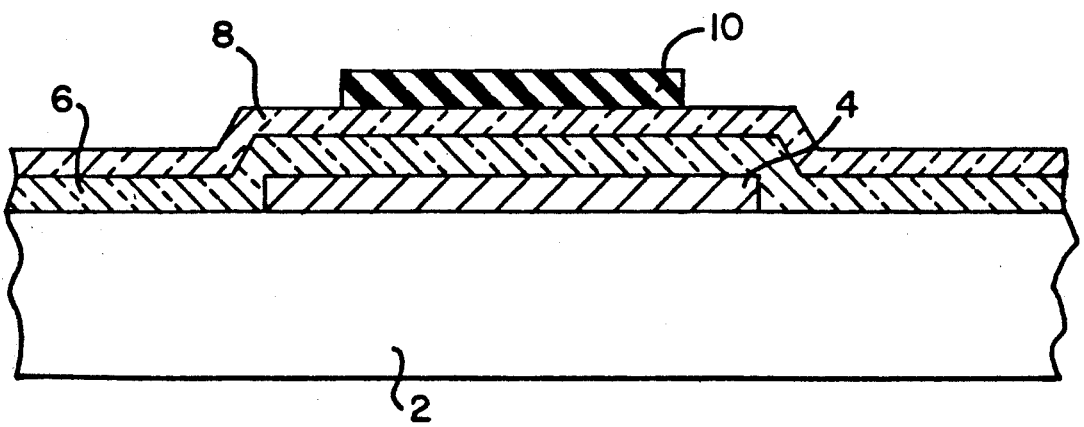
FIG. 3 is a cross-sectional view illustrating the top gate insulating layer etching process.
Figure 4:
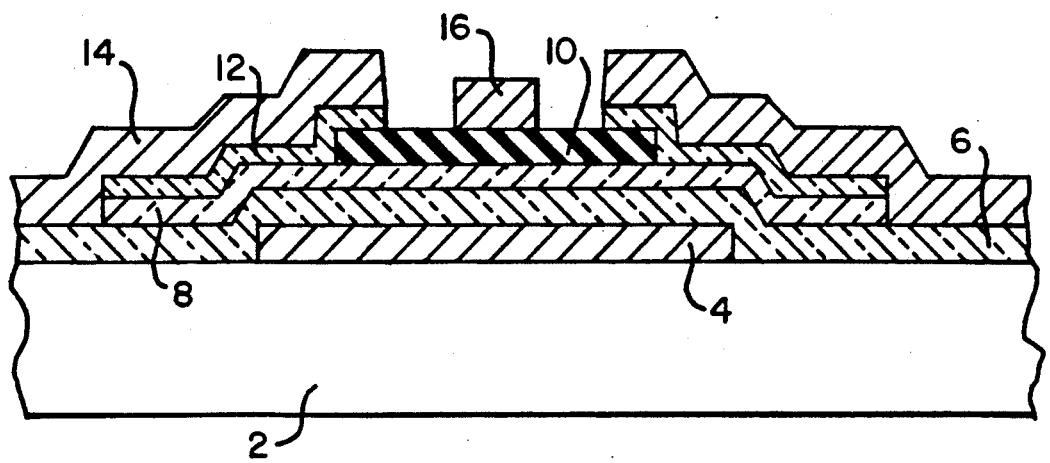
FIG. 4 is a cross-sectional view illustrating the top gate electrode and source/drain etching process.
Figure 5:
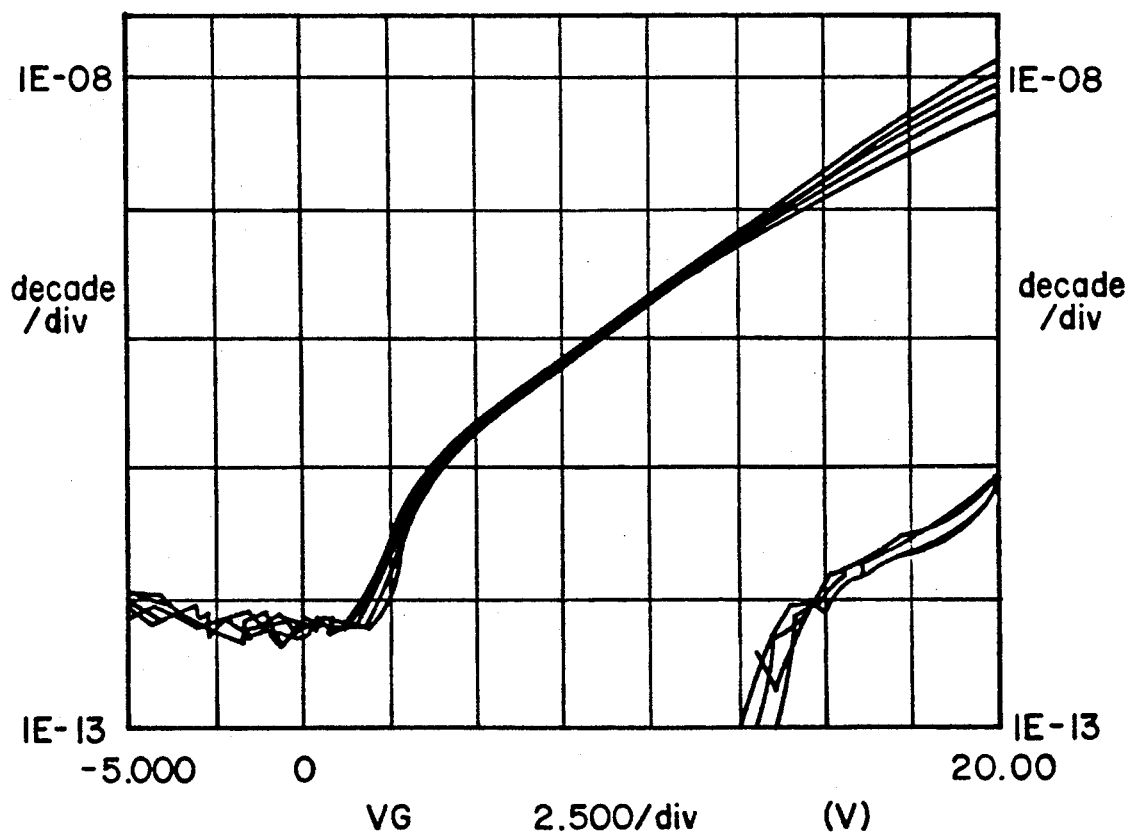
FIG. 5 is a graph illustrating the transfer characteristics of TFT under the conventional operation mode, i.e., whenever the depletion gate is floating.

Then an insulating layer 6, undoped amorphous silicon layer 8, and top insulating layer 10 are grown successively in one pump-down period. Both the insulating layers 6 and 10 are made of plasma enhanced chemical vapor deposition, and have the thickness of 2000 Angstroms. The undoped layer 8 has a thickness of 1000 Angstroms. The contact regions of source and drain are then opened, as shown in FIG. 3, by photolithography and dry etching technology. A phosphorous doped amorphous silicon 12 with a thickness of 500 angstroms is then deposited as the contact layer of source and drain. After the thin oxide region of the thin film transistor is defined, a metal film (for example, molybdenum or aluminum) is deposited by sputtering as the source/drain metallization 14 and the depletion gate electrode 16, as shown in FIG. 4.

While the invention has been described in detail by reference to preferred embodiments thereof, it is understood that variations and modifications may be made without departing from the true spirit and scope of the invention.

What is claimed is:

1. An amorphous semiconductor thin film field effect transistor comprising:
   (a) an insulating substrate;
   (b) an accumulation gate electrode overlying said substrate;
   (c) a bottom insulating layer overlying said accumulation gate electrode and said insulating substrate;
   (d) an amorphous semiconductor channel layer overlying said bottom insulating layer;
   (e) a top insulating layer overlying a portion of said bottom insulating layer and being centered with respect to said accumulation gate electrode;
   (f) a source amorphous semiconductor layer and a drain amorphous semiconductor layer, said source and drain semiconductor layers being of a first conductivity type and overlying opposite portions of said top insulating layer and being in contact with respective opposite portions of said channel layer not covered by said top insulating layer, said source and drain semiconductor layers being separated from one another by an intermediate portion of said channel layer overlying said accumulation gate;
   (g) metallic source and drain electrodes overlying said source and drain semiconductor layers, respectively; and
   (h) a metallic depletion gate disposed on said top insulating layer and over said intermediate portion of said channel layer, said intermediate portion of said channel layer being juxtaposed between said accumulation gate and said depletion gate, said channel layer having charge carrier flow therethrough between said source and drain semiconductor layers that is enhanced by one potential on said accumulation gate and is depleted by an opposite potential on said depletion gate.

2. The transistor of claim 1, wherein said amorphous semiconductor channel layer comprises amorphous silicon; said source and drain semiconductor layers comprise amorphous silicon having an N-type impurity whereby said conductivity type is N so that the charge carriers in said channel layer comprise electrons; and said one potential is a positive potential and said opposite potential is a negative potential.

3. The transistor of claim 1 wherein said accumulation gate underlies the entirety of said intermediate portion of said channel layer and wherein said depletion gate overlies only part of said intermediate portion of said channel layer, said depletion gate being centered with respect to said accumulation gate.

4. The transistor of claim 2 wherein said amorphous semiconductor channel layer comprises amorphous silicon; said source and drain semiconductor layers comprise amorphous silicon having a P-type impurity whereby said conductivity type is P so that the charge carriers in said channel layer comprise holes; and said one potential is a negative potential and said opposite potential is a positive potential.

* * * * *